United States Patent
Jeon

(10) Patent No.: US 8,036,333 B2
(45) Date of Patent: Oct. 11, 2011

(54) CLOCK AND DATA RECOVERY CIRCUIT AND METHOD OF RECOVERING CLOCKS AND DATA

(75) Inventor: Phil-Jae Jeon, Osan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 1074 days.

(21) Appl. No.: 11/846,715

(22) Filed: Aug. 29, 2007

(65) Prior Publication Data

US 2008/0056423 A1 Mar. 6, 2008

(30) Foreign Application Priority Data

Aug. 30, 2006 (KR) ........................ 10-2006-0083000

(51) Int. Cl.
*H03D 3/24* (2006.01)
(52) U.S. Cl. ........................ 375/375; 375/374
(58) Field of Classification Search .................. 375/359, 375/373–376
See application file for complete search history.

(56) References Cited

U.S. PATENT DOCUMENTS

| 5,276,716 | A | * | 1/1994 | Wincn ........................ 375/376 |
| 5,452,325 | A | * | 9/1995 | Brown et al. ................. 375/376 |
| 5,479,451 | A | * | 12/1995 | Eldering et al. ............. 375/343 |
| 6,285,219 | B1 | * | 9/2001 | Pauls ............................. 327/3 |

FOREIGN PATENT DOCUMENTS

| JP | 2001-358582 | 12/2001 |
| KR | 2001-0029972 | 12/2002 |
| KR | 1020030002249 A | 1/2003 |

* cited by examiner

*Primary Examiner* — Shuwang Liu
*Assistant Examiner* — David Huang
(74) *Attorney, Agent, or Firm* — F. Chau & Associates, LLC

(57) ABSTRACT

A clock and data recovery circuit that does not use a reference clock and a method of recovering cocks and data, in which the clock and data recovery circuit includes a clock generation unit, a mirror delay unit, a preamble phase detection unit, and a sampling unit. The clock generation unit generates a clock signal such that a phase of the clock signal is locked to a phase of a data signal inputted to the clock generation unit. The mirror delay unit outputs a plurality of delayed preamble signals based on the preamble signal during a preamble period. The preamble phase detection unit provides the charge pump with a preamble phase detection signal having information on a phase difference between the preamble signal and the clock signal during the preamble period. The sampling unit extracts data from the data signal by sampling the data signal with the clock signal.

18 Claims, 8 Drawing Sheets

CLOCK AND DATA RECOVERY CIRCUIT AND METHOD OF RECOVERING CLOCKS AND DATA

CROSS-REFERENCE TO RELATED APPLICATION

This application claims priority under 35 USC §119 to Korean Patent Application No. 10-2006-83000, filed on Aug. 30, 2006 in the Korean Intellectual Property Office (KIPO), the disclosure of which is incorporated herein in its entirety by reference.

BACKGROUND OF THE INVENTION

1. Technical Field

The present disclosure relates to a data receiver and more particularly, to a clock and data recovery (CDR) circuit recovering clocks and data from a data signal of a high frequency and a method of recovering clocks and data.

2. Discussion of Related Art

In general, in order to transfer data at high speed between a transmitter and a receiver that are spaced apart from each other, a receiver has to exactly extract the data from a received data signal. For example, data may be extracted by sampling a received data signal using a clock signal of a frequency that is the same as a carrier frequency of the received data signal.

Typically, such a clock signal is transmitted with a data signal from a transmitter, and a receiver receives the clock signal and the data signal and extracts data by sampling the data signal based on the received clock signal.

According to conventional methods, a clock generation circuit is needed to generate a clock signal in a receiver, and a transmission line, an input pin, and an output pin that are exclusively used are needed for transmitting the clock signal between a transmitter and a receiver. As data transmission systems require faster operating speeds and lower operating voltages, however, the conventional methods for transmitting a clock signal and a data signal through respective transmission lines cause various problems, such as signal skews, jitter, noise, and the like. Therefore, additional efforts for optimizing a physical arrangement of transmission lines are needed to synchronize a data signal with a clock signal and to reduce jitter and noise.

According to a conventional clock and data recovery method, a clock signal is recovered from a data signal without the additional transmission of a clock signal. Therefore, a clock generation circuit is not used in a receiver. A transmission line, an input pin, and an output pin that are exclusively used to transmit the clock signal are unnecessary. Therefore, it takes less effort to synchronize a data signal with a clock signal, so as to reduce jitter and noise.

A basic configuration of a conventional clock and data recovery circuit is similar to a configuration of a phase locked loop circuit, but a data signal instead of a reference frequency is used to recover a clock signal. The clock and data recovery circuit, which is similar to the phase locked loop circuit, includes a phase-frequency detector. The phase-frequency detector compares a phase and a frequency of a received data signal with those of a recovered clock signal.

FIG. 1 is a diagram illustrating a conventional phase-frequency detector used for clock and data recovery.

Referring to FIG. 1, the phase-frequency detector 10, which is known as a Hogge phase detector includes two D flip-flops 11 and 12 that are connected in series to detect whether the phase of a clock signal CLK leads or lags the phase of a data signal DATA, The first D flip-flop 11 may compare a rising edge of the data signal DATA with a rising edge of the clock signal CLK, and a second D flip-flop 12 may compare a falling edge of the data signal DATA with a falling edge of the clock signal CLK. The comparison results may be provided to a charge pump as an up signal UP and a down signal DOWN, respectively.

The Hogge phase detector 10 has a simple configuration so that the Hogge phase detector 10 operates reliably, but the Hogge phase detector 10 has some problems which are as follows. As a data transmission rate rises, the clock signal that is applied to the D flip-flops has a higher frequency. A practical D flip-flop has a limitation in operating speed, however and the higher frequency of the clock signal causes a problem such that a static skew is increased. Moreover, the Hogge phase detector has unstable response characteristics when a data signal contains a large amount of noise, and an output frequency is adversely affected by transitions of the data signal.

SUMMARY OF THE INVENTION

Accordingly, exemplary embodiments of the present invention are provided to substantially obviate one or more problems due to limitations and disadvantages of the related art.

Exemplary embodiments of the present invention provide a clock and data recovery circuit recovering clocks and data even though a data signal of a high frequency is inputted.

Exemplary embodiments of the present invention provide a method of recovering clocks and data even though a data signal of a high frequency is inputted.

In exemplary embodiments of the present invention, a clock and data recovery circuit includes a clock generation unit, a mirror delay unit, a preamble phase detection unit, and a sampling unit. The clock generation unit includes a phase-frequency detector, a charge pump, and a voltage controlled oscillator. The clock generation unit is configured to generate a clock signal such that a phase of the clock signal is locked to a phase of a data signal inputted to the clock generation unit. The mirror delay unit is configured to output a plurality of delayed preamble signals based on the preamble signal during a preamble period, the delayed preamble signals having predetermined phase differences with respect to a preamble signal. The preamble phase detection unit is configured to provide the charge pump with a preamble phase detection signal having information on a phase difference between the preamble signal and the clock signal during the preamble period. The sampling unit is configured to extract data from the data signal by sampling the data signal with the clock signal.

The clock generation unit may include a phase-frequency detector configured to output a data phase detection signal having information on a phase difference between the data signal and the clock signal, a charge pump configured to output a control voltage that is adjusted by the preamble phase detection signal during the preamble period and by the data phase detection signal after the preamble period, and a voltage controlled oscillator configured to output the clock signal having a frequency that is proportional to the control voltage, and configured to provide the preamble phase-frequency detector with a plurality of delayed clock signals having predetermined phase differences with respect to the clock signal. The voltage controlled oscillator may include a plurality of differential delay cells, and may be configured to output the delayed clock signals that are delayed by predetermined times by the differential delay cells from output terminals of differential delay cells. Each of the differential delay cells included in the voltage controlled oscillator may be configured to delay the clock signals by a time that is one-eighth of a period of the preamble signal.

The mirror delay unit may include a plurality of series-connected differential delay cells and may be configured to output the delayed preamble signals that are delayed by predetermined times by the differential delay cells. The differential delay cells included in the mirror delay unit may be configured to delay the delayed preamble signals by the same delay time as the differential delay cells included in the voltage controlled oscillator. Each of the differential delay cells included in the mirror delay unit may be configured to delay the delayed preamble signals by a time that is one-eighth of a period of the preamble signal.

The preamble phase detection signal may include a first preamble phase detection signal and a second preamble phase detection signal, and the preamble phase detection unit may be configured to output the first preamble phase detection signal having information on a phase difference between the preamble signal and one of the delayed preamble signals, and may be configured to output the second preamble phase detection signal having information on a phase difference between the preamble signal and one of the delayed clock signals, and the charge pump may be configured to increase the phase of the clock signal in the case that a pulse width of the second preamble phase detection signal is narrower than a pulse width of the first preamble phase detection signal, and may be configured to decrease the phase of the clock signal in the case that the pulse width of the second preamble phase detection signal is wider than the pulse width of the first preamble phase detection signal.

The delayed clock signals may include a first delayed clock signal, a second delayed clock signal, and a third delayed clock signal, and the delayed preamble signals may include a first delayed preamble signal, a second delayed preamble signal and a third delayed preamble signal, and the preamble phase detection unit may be configured to output a first preamble phase detection signal that is in an active state from when the preamble signal rises and falls to when the second delayed preamble signal rises and falls, respectively, and may be configured to output a second preamble phase detection signal that is in an active state from when the preamble signal rises and falls to when the second delayed clock signal rises and falls, respectively.

The preamble phase detection unit may include a first set-reset latch (SR latch) that may be configured to output the first preamble phase detection signal, may be configured to be set at a rising edge and a falling edge of the preamble signal, and may be configured to be reset at a rising edge and a falling edge of the second delayed preamble signal, and a second SR latch that may be configured to output the second preamble phase detection signal, may be configured to be set at a rising edge and a falling edge of the preamble signal, and may be configured to be reset at a rising edge and a falling edge of the second delayed clock signal. The first SR latch may be configured to be set by a first set signal that is in an active state from when the preamble signal rises and falls to when the first delayed preamble signal rises and falls, respectively, and may be configured to be reset by a first reset signal that is in an active state from when the second delayed preamble signal rises and falls to when the third delayed preamble signal rises and falls, respectively, and the second SR latch may be configured to be set by a second set signal that is in an active state from when the preamble signal rises and falls to when the first delayed preamble signal rises and falls, respectively, and may be configured to be reset by a second reset signal that is in an active state from when the second delayed clock signal rises and falls to when the third delayed clock signal rises and falls, respectively.

The sampling unit may include a D flip-flop configured to output the data signal in response to one of the delayed clock signals.

In exemplary embodiments of the present invention, a method of recovering clocks and data includes recovering a clock signal in response to a preamble phase detection signal having information on a phase difference between a preamble signal and the clock signal during a preamble period, maintaining a phase and a frequency of the clock signal in response to a data phase detection signal having information on a phase difference between the data signal and the clock signal after the preamble period, and extracting data from the data signal by sampling the data signal with the clock signal.

Recovering the clock signal during the preamble period may include generating a plurality of delayed preamble signals having predetermined phase differences with respect to the preamble signal, generating a plurality of delayed clock signals having predetermined phase differences with respect to the clock signal, generating the preamble phase detection signal having the information on the phase difference between the preamble signal and the clock signal based on the preamble signal, the delayed preamble signals, and the delayed clock signals, and adjusting the phase of the clock signal in response to the preamble phase detection signal, such that the phase of the clock signal is locked to the phase of the preamble signal. Delay times between the delayed preamble signals may be the same, and a sum of the delay times between the delayed preamble signals may be shorter than a half of a period of the preamble signal. Each of the delay times may be one-eighth of the period of the preamble signal. Delay times between the delayed clock signals may be the same, and a sum of the delay times between the delayed clock signals may be shorter than a half of a period of the preamble signal. Each of the delay times may be one-eighth of the period of the preamble signal. Delay times between the delayed preamble signals may be the same as delay times between the delayed clock signals.

The preamble phase detection signal may include a first preamble phase detection signal and a second preamble phase detection signal, and generating the preamble phase detection signal may include outputting the first preamble phase detection signal having information on a phase difference between the preamble signal and one of the delayed preamble signals and outputting the second preamble phase detection signal having information on a phase difference between the preamble signal and one of the delayed clock signals, and adjusting the phase of the clock signal may include increasing the phase of the clock signal in the case that a pulse width of the second preamble phase detection signal is narrower than a pulse width of the first preamble phase detection signal and decreasing the phase of the clock signal in the case that the pulse width of the second preamble phase detection signal is wider than the pulse width of the first preamble phase detection signal.

The delayed clock signals may include a first delayed clock signal, a second delayed clock signal, and a third delayed clock signal and the delayed preamble signals may include a first delayed preamble signal, a second delayed preamble signal, and a third delayed preamble signal, and the preamble phase detection signal may include a first preamble phase detection signal and a second preamble phase detection signal, and generating the preamble phase detection signal may include activating the first preamble phase detection signal from when the preamble signal rises and falls to when the second delayed preamble signal rises and falls, respectively, and activating the second preamble phase detection signal from when the preamble signal rises and falls to when the second delayed clock signal rises and falls, respectively, and adjusting the phase of the clock signal may include increasing the phase of the clock signal in the case that a pulse width of the second preamble phase detection signal is narrower than a pulse width of the first preamble phase detection signal and decreasing the phase of the clock signal in case that the pulse width of the second preamble phase detection signal is wider than the pulse width of the first preamble phase detection signal.

Generating the preamble phase detection signal may include activating the first preamble phase detection signal by using a first SR latch configured to be set by a first set signal that is in an active state from when the preamble signal rises and falls to when the first delayed preamble signal rises and falls, respectively and may be configured to be reset by a first reset signal that is in an active state from when the second delayed preamble signal rises and falls to when the third delayed preamble signal rises and falls, respectively; activating the second preamble phase detection signal by using a second SR latch configured to be set by a second set signal that is in an active state from when the preamble signal rises and falls to when the first delayed preamble signal rises and felts respectively, and may be configured to be reset by a second reset signal that is in an active state from when the second delayed clock signal rises and falls to when the third delayed clock signal rises and falls, respectively.

Extracting the data from the data signal by sampling the data signal with the clock signal may include outputting the data when one of the delayed clock signals is in an active state.

Therefore, clocks and data may be stably recovered even though the data signal has a higher data transmission rate than a conventional data signal.

BRIEF DESCRIPTION OF THE DRAWINGS

Exemplary embodiments of the present invention will be understood in more detail from the following descriptions taken in conjunction with the accompanying drawings.

DESCRIPTION OF EXEMPLARY EMBODIMENTS

Figure 1:
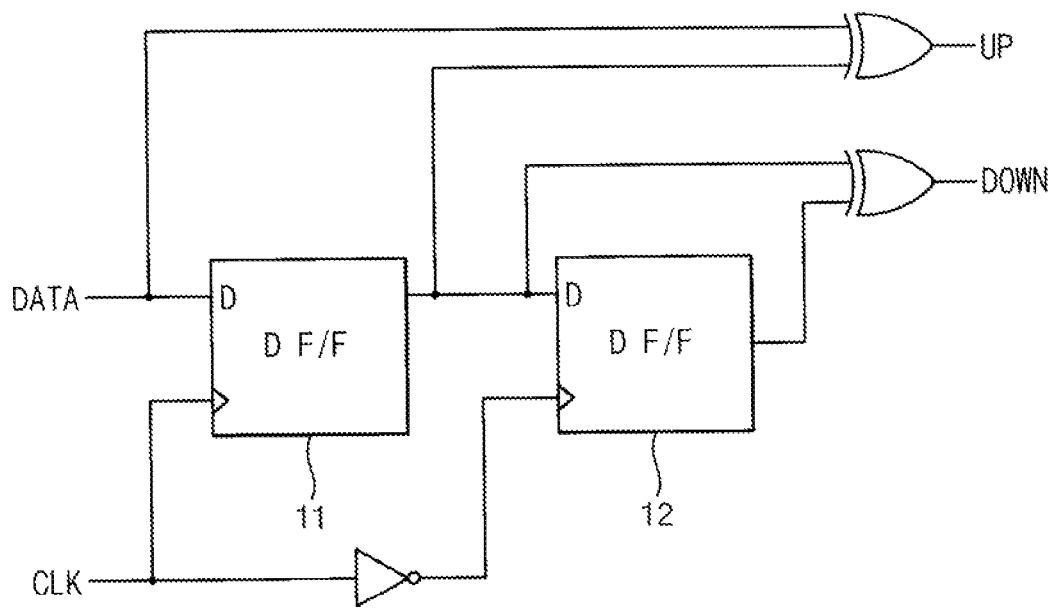
FIG. 1 is a diagram illustrating a conventional phase-frequency detector used for a clock and data recovery.

Exemplary embodiments of the present invention now will be described more fully with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure will be thorough and complete, and will fully convey the scope of the invention to those of ordinary skill in the art. Like reference numerals refer to like elements throughout this application.

Figure 2:
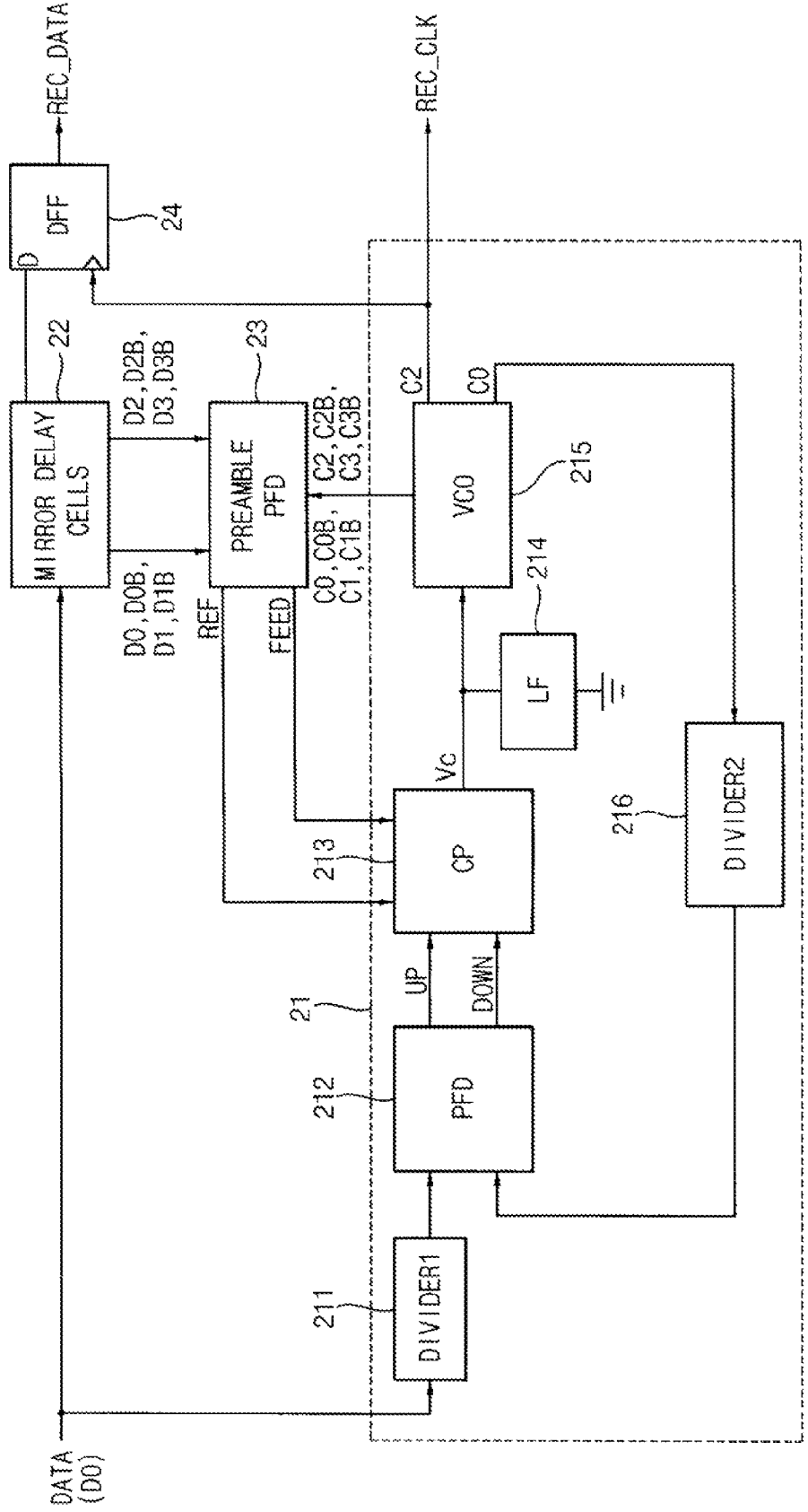
FIG. 2 is a block diagram illustrating a clock and data recovery circuit according to an exemplary embodiment of the present invention.

FIG. 2 is a block diagram illustrating a clock and data recovery circuit according to an exemplary embodiment of the present invention.

Referring to FIG. 2, the clock and data recovery circuit 20 includes a clock generation unit 21, a mirror delay unit 22, a preamble phase detection unit 23, and a sampling unit 24.

The mirror delay unit 22 and the preamble phase detection unit 23 are activated to cause the clock generation unit 21 to generate a recovered clock signal REC_CLK based on an input preamble signal D0 that is part of the data signal DATA. The preamble phase detection unit 23 is deactivated after the recovered clock signal REC_CLK is generated and locked. The clock generation unit 21 is configured to be deactivated during a preamble period, and to be activated to continuously maintain a phase and a frequency of the recovered clock signal REC_CLK after the preamble period. The sampling unit 24 is configured to extract recovered data REC_DATA from the data signal DATA by using the recovered clock signal REC_CLK.

The clock generation unit 21 includes a first divider 211, a phase-frequency detector 212, a charge pump 213, a loop filter 214, a voltage controlled oscillator 215, and a second divider 216 to maintain the phase and the frequency of the recovered clock signal REC_CLK.

The first divider 211 divides a frequency of the data signal DATA by N, and the second divider 216 divides a frequency of a clock signal C0 by N. The first divider 211 and the second divider 216 may be optionally omitted, because phase detections may not need to be performed for every clock. The phase-frequency detector 212, however, may not operate properly in the case that the clock signal C0 is applied to the phase-frequency detector 212 without division, and a loop bandwidth of the clock generation unit 21 may be limited. Therefore, the first divider 211 and the second divider 216 may be included, so as to lower an operating frequency. For example, a phase-frequency detector formed by a complementary metal oxide semiconductor process may not operate properly at an operating frequency above 500 MHz, but the phase-frequency detector may operate properly at an operating frequency below 2 GHz by using a divider having a division ratio of four.

The phase-frequency detector 212 may compare phases and frequencies of the divided data signal DATA with those of the divided clock signal C0, and output a data phase detection signal having information on a difference between the phase of the data signal DATA and the phase of the clock signal C0. The data phase detection signal may be an up signal UP or a down signal DOWN. The up signal UP may have a longer active period than the down signal DOWN in the case that the data signal DATA leads the clock signal C0, and the up signal UP may have a shorter active period than the down signal DOWN in the case that the data signal DATA lags the clock signal C0. In exemplary embodiments, the Hogge phase detector described above may be used.

The charge pump 213 outputs a control voltage Vc adjusted by the up signal UP and the down signal DOWN after the clock signal C0 is locked. The charge pump 213 increases the control voltage Vc while the up signal UP is activated, and the charge pump 213 decreases the control voltage Vc while the down signal DOWN is activated. In exemplary embodiments, a pull-up current source and a pull-down current source that are connected in series between a power voltage electrode and a ground electrode may be included. If the pull-up current source and the pull-down current source are included, the pull-up current source and the pull-down current source are connected or disconnected to an output terminal in response to the up signal UP and the down signal DOWN, respectively.

Before the clock signal C0 is locked, the charge pump 213 outputs the control voltage Vc that is adjusted by a preamble phase detection signal that is outputted from the preamble phase detection unit 23 while the mirror delay unit 22 and the preamble phase detection unit 23 are activated to lock the clock signal C0. The preamble phase detection signal may include a first preamble phase detection signal and a second preamble phase detection signal. The first preamble phase detection signal may be a reference detection signal REF: and the second preamble phase detection signal may be a feedback detection signal FEED. The up signal UP may correspond to the reference detection signal REF, and the down signal DOWN may correspond to the feedback detection signal FEED.

The voltage controlled oscillator 215 generates and outputs the clock signal C0 having a frequency that is proportional to the control voltage Vc. The clock signal C0 is fed back to the phase-frequency detector 212 through the second divider 216. The voltage controlled oscillator 215 may output a plurality of clock signals C0, C1, C2, and C3 of which the relative phase differences are predetermined. One of the clock signals C0, C1, C2, and C3, for example, a second delayed clock signal C2, may be applied to the sampling unit 24 and/or to internal circuits (not shown) as the recovered clock signal REC_CLK.

The clock generation unit 21 having a configuration described above may maintain the frequency and the phase of the recovered clock signal REC_CLK.

Referring again to FIG. 2, the mirror delay unit 22 generates a first, second, and third delayed preamble signals D1, D2, and D3 that are delayed from a preamble signal D0 by predetermined phases. The mirror delay unit 22 also generates complementary delayed preamble signals D1B, D2B, and D3B that are inversion signals of the first, second, and third delayed preamble signals D1, D2, and D3, respectively. The mirror delay unit 22 may output the data signal DATA without delay after the preamble period.

In exemplary embodiments, the preamble phase detection unit 23 generates the reference detection signal REF in response to a rising edge and a falling edge of the preamble signal D0 by using the preamble signal D0, a complementary preamble signal D0B that is an inversion signal of the preamble signal D0, the first, second, and third delayed preamble signals D1, D2, and D3, and a first, second, and third complementary delayed preamble signals D1B, D2B, and D3B. The preamble phase detection unit 23 also generates the feedback detection signal FEED that has information on a phase difference between the preamble signal D0 and the clock signal C0 in response to the preamble signal D0, the complementary preamble signal D0B, the first, second, and third delayed preamble signals D1, D2, and D3, and the first, second, and third complementary delayed preamble signals D1B, D2B, and D3B, a first, second, and third delayed clock signals C1, C2, and C3 that are delayed from the clock signal C0 by predetermined phases, and a first, second, and third complementary delayed clock signals C1B, C2B, and C3B that are inversion signals of the first, second, and third delayed clock signals C1, C0, and C3, respectively. As described above, the reference detection signal REF and the feedback detection signal FEED are provided to the charge pump 213 during the preamble period, and then the voltage controlled oscillator 215 generates the clock signal C0 and the delayed clock signals C1, C2, and C3 in response to the control voltage Vc generated by the charge pump 213 and outputs one of the clock signals C0, C1, C2, C3 as the recovered clock signal REC_CLK.

The sampling unit 24 samples the data signal DATA in response to the recovered clock signal REC_CLK. The sampling unit 24 may be implemented with a D flip-flop. The D flip-flop may extract the recovered data REC_DATA by sampling the data signal DATA in synchronization with transitions of the recovered clock signal REC_CLK.

In general, sampling near the center of the eye of a data signal is reliable. A clock and data recovery circuit according to exemplary embodiments of the present invention may be configured such that the recovered clock signal REC_CLK transitions at the center of the eye of the data signal DATA. In other words, the clock and data recovery circuit may be configured to extract the recovered data REC_DATA by sampling the data signal DATA at the center of the eye. In the case that the phase of the clock signal C0 is the same as the phase of the data signal DATA, a delayed clock signal for example the second delayed clock signal C2, that lags the clock signal C0 by a phase difference of 90 degrees may be used to sample the data signal DATA at the center of the eye.

Hereinafter, locking the clock signal C0 using the mirror delay unit 22 and the preamble phase detection unit 23 will be described in detail.

In general, a data signal does not have data information during an initial period of the data signal, in which the data signal regularly transitions. A data signal during the initial period is referred to as a preamble signal or a training signal, and the initial period is referred to as a preamble period. In this exemplary embodiment, the preamble signal indicates that a data signal is transmitted after predetermined bits or after a predetermined time. The preamble signal typically has a duty rate of about 50% and a frequency that is one half a data transfer rate.

A clock and data recovery circuit according to exemplary embodiments of the present invention recovers a clock signal for sampling a data signal by using such a preamble signal. For example, the clock and data recovery circuit may generate a clock signal having a frequency of twice a frequency of the preamble signal by using the typical preamble signal, and then the clock and data recovery circuit recovers data by sampling the data signal, which is inputted after the preamble signal, by using the recovered clock signal.

The frequency of the typical preamble signal that is one half of a frequency of the data signal is relatively higher than an operating frequency of a clock generation unit. As described above, the conventional Hogge phase detector detects a phase difference between a rising edge of a data signal and a rising edge of a delayed data signal by an exclusive OR operation between the data signal and the delayed data signal that is delayed by a D flip-flop. The D flip-flop is the primary element that limits the operating frequency of the Hogge phase detector. If a delayed data signal is generated without a D flip-flop in a phase-frequency detector, edges may be detected at a high frequency and, thus, a phase difference may be detected at a high frequency. The preamble phase detection unit 23 in FIG. 2 generates delayed preamble signals by using a mirror delay unit 22 including delay cells substantially identical to delay cells included in the voltage controlled oscillator 215, so that the preamble phase detection unit 23 may operate properly at a high operating frequency, which is different from the phase-frequency detector 212 included in the clock generation unit 21.

The first, second, and third delayed preamble signals D1, D2, and D3 that are delayed from the preamble signal D0 by phases of 45 degrees, 90 degrees, and 135 degrees, respectively, and The first, second, and third complementary delayed preamble signals D1B, D2B, and D3B that are inversion signals of the first, second, and third delayed preamble signals D1, D2, and D3, respectively, are generated in the mirror delay unit 22. The delay phase of 45 degrees corresponds to one-eighth of a period of the preamble signal D0. In exemplary embodiments, an angle of a delay phase need not necessarily be 45 degrees, or a delay time need not necessarily be one-eighth of the period of the preamble signal D0. Delay phases or delay times of the delay cells may be the same, and a sum of the delay phases and a sum of the delay times may be shorter than 180 degrees and shorter than a half of the period of the preamble signal, respectively.

Figure 3A:
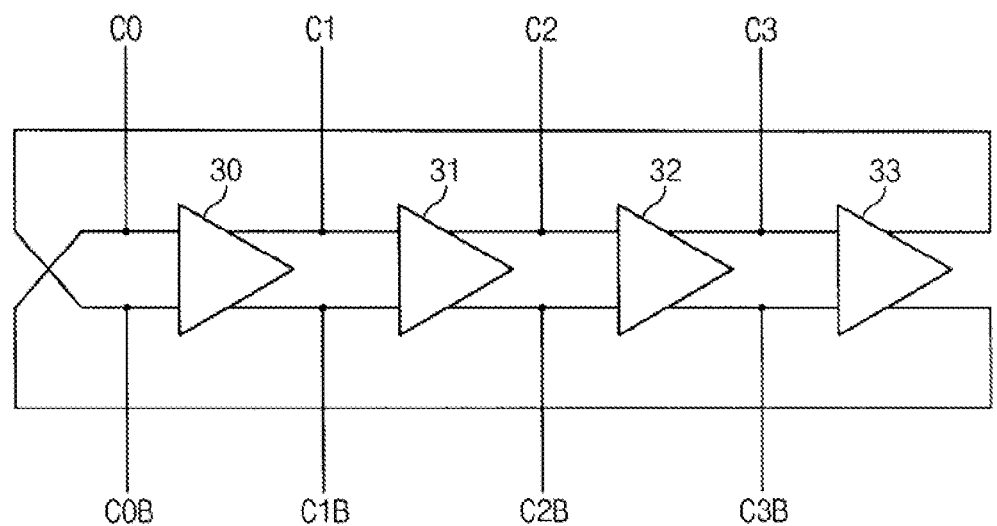
FIG. 3A is a block diagram illustrating a voltage controlled oscillator included in the clock and data recovery circuit of FIG. 2.
Figure 3B:
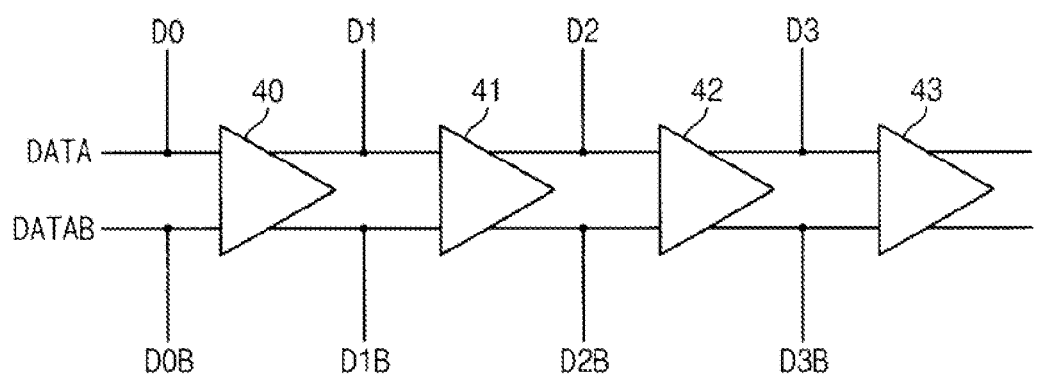
FIG. 3B is a block diagram illustrating a mirror delay unit included in the clock and data recovery circuit of FIG. 2.

FIG. 3A is a block diagram illustrating a voltage controlled oscillator, such as 215, included in the clock and data recovery circuit 20 of FIG. 2, and FIG. 3B is a block diagram illustrating a mirror delay unit, such as 22, included in the clock and data recovery circuit 20 of FIG. 2.

Referring to FIG. 3A, the voltage controlled oscillator 215 of FIG. 2 may be implemented with a differential ring oscillator to which a control voltage (not shown) is applied as a power supply. The differential ring oscillator may include an even number of differential delay cells. If the differential ring oscillator includes four differential delay cells 30, 31, 32, and 33 having the same delay time, as illustrated in FIG. 3, delayed clock signals C1, C2, and C3 having phase differences with respect to a clock signal C0 by phases of 45 degrees, 90 degrees, and 135 degrees, respectively, and complementary delayed clock signals C1B, C2B, and C3B that are inversion signals of the delayed clock signals C1, C2, and C3, respectively, are outputted from output terminals of the differential delay cells, respectively, along with clock signal CO and inverted clock signal COB. In this exemplary embodiment, a delay time of each of the differential delay cells is one-eighth of the period of a preamble signal or a quarter of a period of a data signal.

In exemplary embodiments, the voltage controlled oscillator may be implemented with a ring oscillator that does not have differential delay cells but has single-ended delay cells. In that case, because the voltage controlled oscillator includes an odd number of delay cells, delayed clock signals having phase differences that are not 45 degrees may be generated.

Referring to FIG. 3B, the mirror delay unit 22 of FIG. 2 includes differential delay cells having the same number and the same delay time as those of the differential delay cells included in the voltage controlled oscillator. In FIG. 3A, the voltage controlled oscillator includes four differential delay cells 30, 31, 32, and 33, similarly in FIG. 3B, the mirror delay unit includes four differential delay cells 40, 41, 42, and 43. Delayed preamble signals D1, D2, and D3 having phase differences with respect to a preamble signal D0 by phases of 45 degrees, 90 degrees, and 135 degrees, respectively, and complementary delayed preamble signals D1B, D2B, and D3B that are inversion signals of the delayed preamble signals D1, D2, and D3 respectively, are outputted from output terminals of the differential delay cells included in the mirror delay unit, respectively, along with a preamble signal DO and inverted preamble signal DOB. The delay time of each of the differential delay cells included in the mirror delay unit corresponds to one-eighth of the period of the preamble signal D0.

In exemplary embodiments, the mirror delay unit may be implemented with a ring oscillator that does not have differential delay cells but has single-ended delay cells. In that case, because the mirror delay unit includes an odd number of delay cells, delayed preamble signals having phase differences that are not 45 degrees may be generated.

Referring back to FIG. 2, the preamble phase detection unit 23 generates the reference detection signal REF in response to a rising edge and a falling edge of the preamble signal D0 by using all or some of the preamble signal D0, the complementary preamble signal D0B, the first, second, and third delayed preamble signals D1, D2, and D3, and the first, seconds and third complementary delayed preamble signals D1B, D2B, and D3B. The reference detection signal REF may be activated at the rising edge or the failing edge of the preamble signal D0, and the reference detection signal REF may be deactivated after a predetermined time, for example, a quarter of the period of the preamble signal D0. In that case, at least the preamble signal D0 and the complementary preamble signal D0B are necessary to detect the rising edge or the falling edge of the preamble signal D0. At least the second delayed preamble signal D2 and the second complementary delayed preamble signal D2B are necessary to determine a point in time that the reference detection signal REF is deactivated at a half of an active period of the preamble signal D0. The reference detection signal REF may be deactivated at another point in time by using another delayed preamble signal and the corresponding complementary delayed preamble signal.

The preamble phase detection unit 23 also generates the feedback detection signal FEED by using all or some of the preamble signal D0, the complementary preamble signal D0B, the first, second, and third delayed preamble signals D1 D2, and D3, and the first, second, and third complementary delayed preamble signals D1B, D2B, and D3B, the first, second, and third delayed clock signals C1, C2, and C3, and the complementary delayed clock signals C1B, C2B, and C3B. The feedback detection signal FEED may be activated at the rising edge or the falling edge of the preamble signal D0, and the feedback detection signal FEED may be deactivated after a predetermined time, for example, the feedback detection signal FEED may be deactivated when one of the delayed clock signals C1, C2, and C3 rises. In that case, at least the preamble signal D0 and the complementary preamble signal D0B are necessary to detect the rising edge or the falling edge of the preamble signal D0. At least one of the delayed clock signal and an inversion signal of one of the delayed clock signal, for example, the second delayed clock signal C2 and the second complementary delayed clock signal C2B, are necessary to detect a rising edge of the one of the delayed clock signal.

An active period of the feedback detection signal FEED may be shorter than an active period of the reference detection signal REF in the case that the phase of the clock signal C0 lags the phase of the preamble signal D0. In contrast, the active period of the feedback detection signal FEED may be longer than the active period of the reference detection signal REF in the case that the phase of the clock signal C0 leads the phase of the preamble signal D0. If the feedback detection signal FEED and the reference detection signal REF have the same phase, the active period of the feedback detection signal FEED may be the same as the active period of the reference detection signal REF.

Hereinafter, examples of generating the feedback detection signal FEED and the reference detection signal REF are described in detail.

Figure 4A:
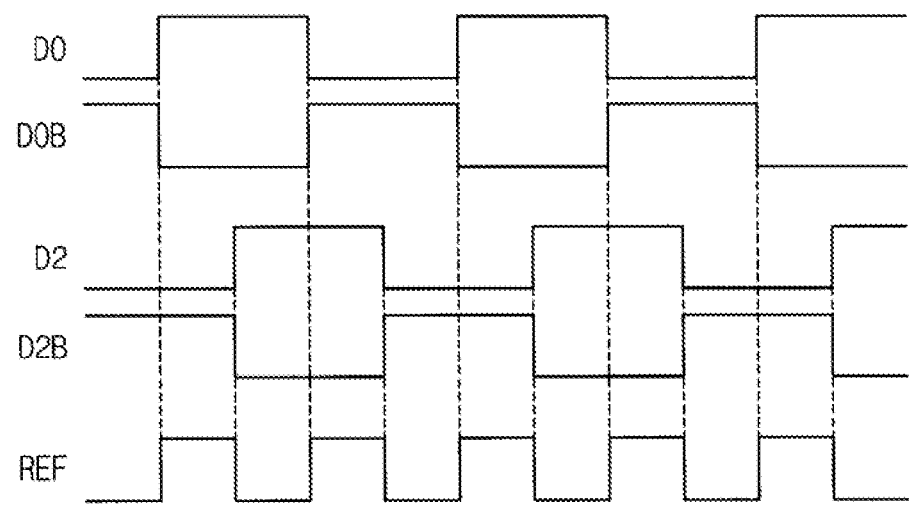
FIG. 4A is a timing diagram illustrating a process of generating a reference detection signal from a preamble signal by a preamble phase detection unit included in the clock and data recovery circuit of FIG. 2.
Figure 4B:
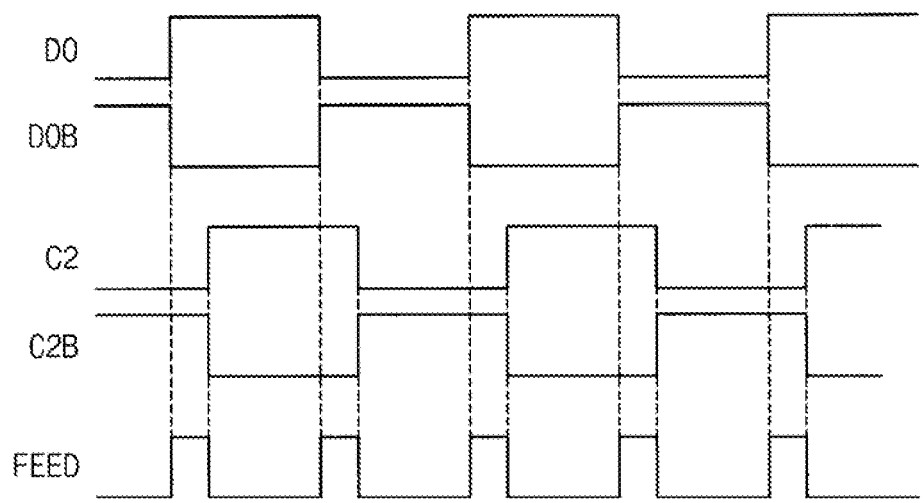
FIG. 4B is a timing diagram illustrating a process of generating a feedback detection signal from a preamble signal by a preamble phase detection unit included in the clock and data recovery circuit of FIG. 2.

FIG. 4A is a timing diagram illustrating a process of generating a reference detection signal (REF) from a preamble signal by a preamble phase detection unit included in the clock and data recovery circuit of FIG. 2, and FIG. 4B is a timing diagram illustrating a process of generating a feedback detection signal (FEED) from a preamble signal by a preamble phase detection unit included in the clock and data recovery circuit of FIG. 2.

Referring to FIG. 4A, the reference detection signal REF is generated by using a preamble signal D0, a second delayed preamble signal D2 that is delayed from the preamble signal D0 by a phase of 90 degrees, and complementary signals D0B and D2B that are inversion signals thereof, respectively. The reference detection signal REF is in an active state from rising and falling edges of the preamble signal D0 to rising and failing edges of the second delayed preamble signal D2, respectively, Referring to FIG. 4B, the feedback detection signal FEED is generated by using a preamble signal D0, a second delayed clock signal C2 that is delayed from a clock signal C0 by a phase of 90 degrees, and complementary signals D0B and C2B that are inversion signals thereof, respectively. The feedback detection signal FEED is in an active state from rising and falling edges of the preamble signal D0 to rising and failing edges of the second delayed clock signal C2, respectively.

Figure 5A:
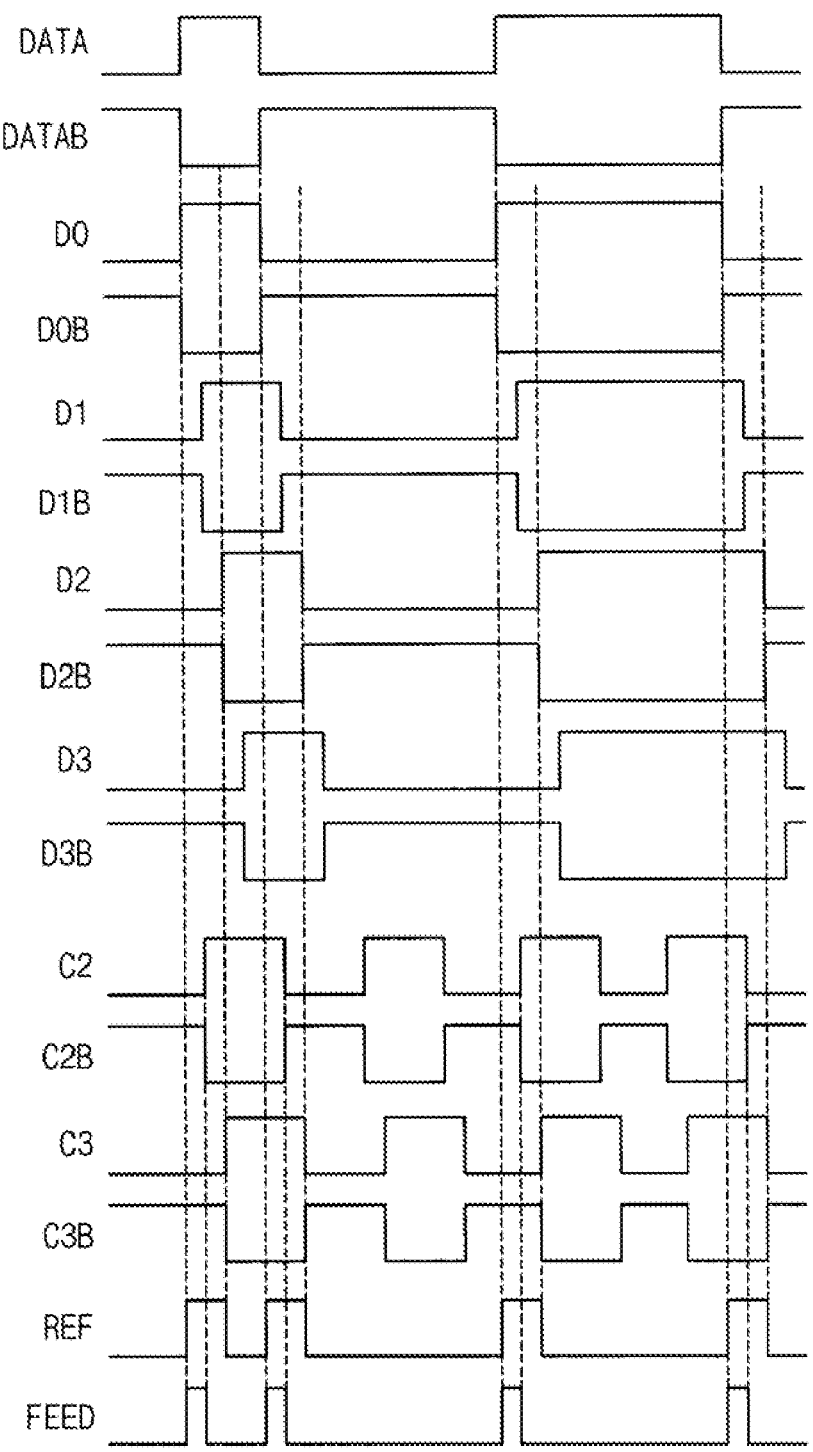
FIG. 5A, FIG. 5B, and FIG. 5C are timing diagrams illustrating processes of generating feedback detection signals based on preamble signals and clock signals by a preamble phase detection unit included in the clock and data recovery circuit of FIG. 2.
Figure 5B:
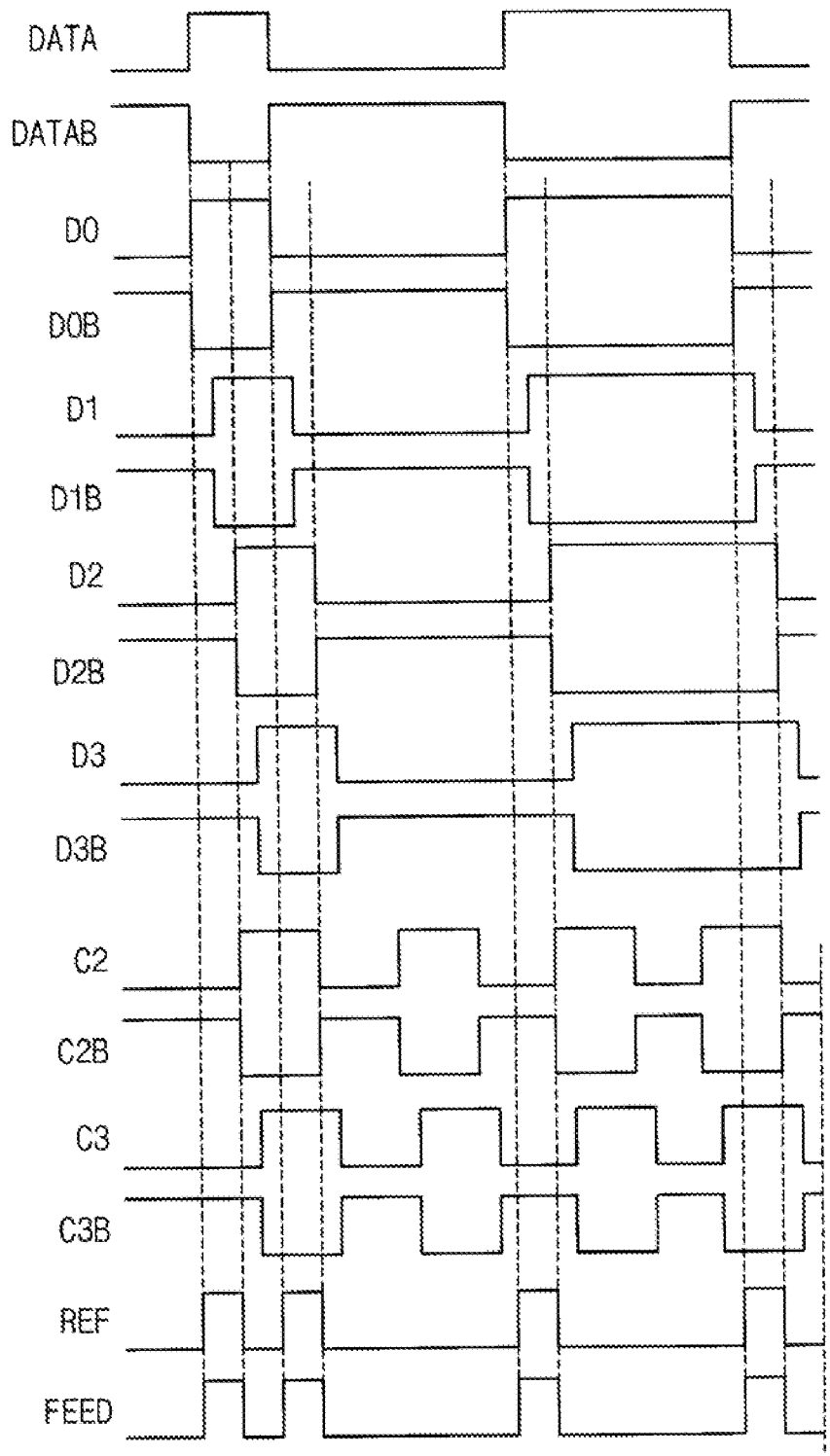
Figure 5C:
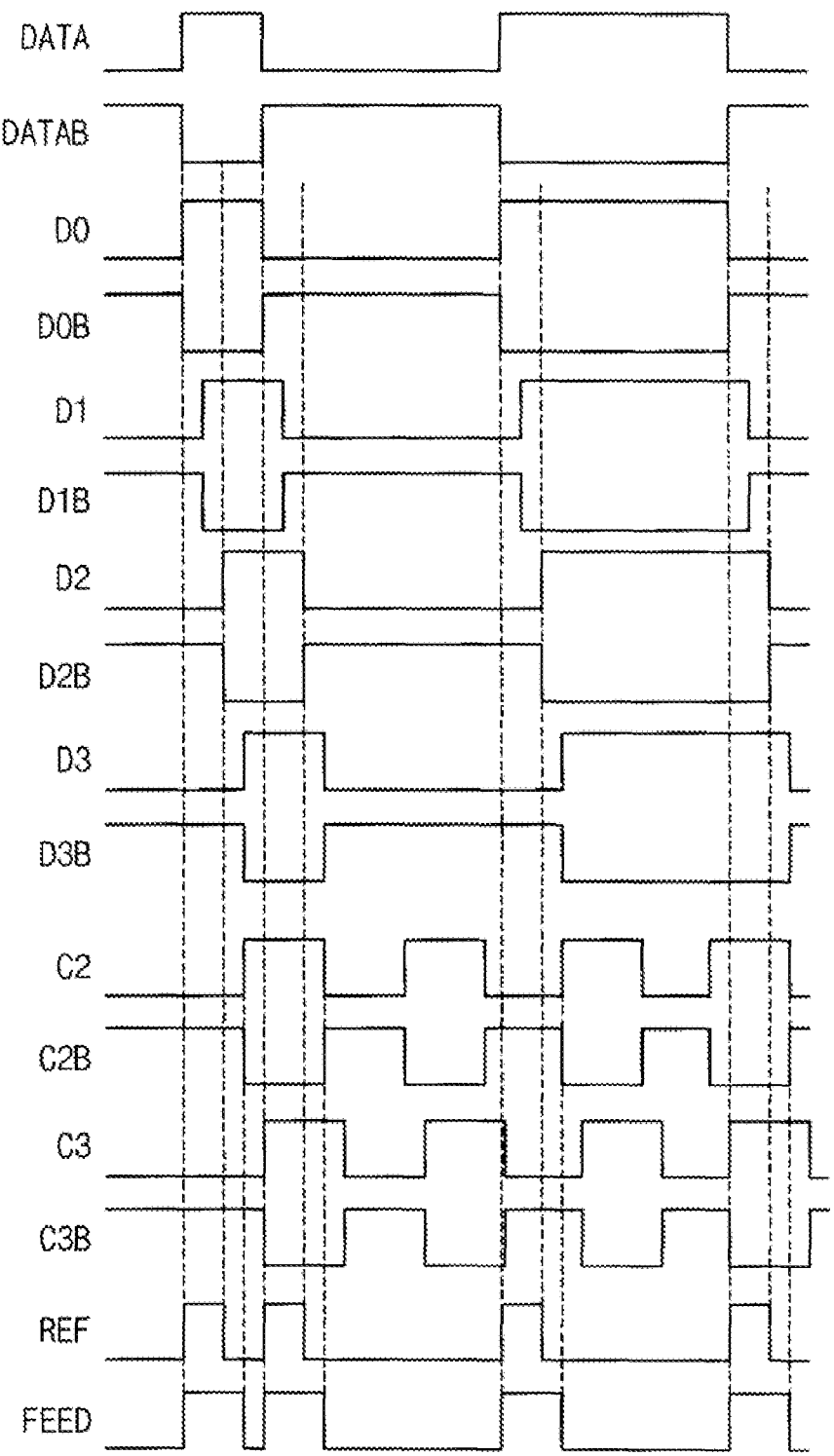

FIG. 5A, FIG. 5B, and FIG. 5C are timing diagrams illustrating processes of generating feedback detection signals based on preamble signals and clock signals by a preamble phase detection unit included in the clock and data recovery circuit of FIG. 2.

FIG. 5A illustrates the case that the phase of the clock signal C0 leads the phase of the preamble signal D0. The feedback detection signal FEED is deactivated before the reference detection signal REF is deactivated. Therefore, the phase of the clock signal C0 is decreased. FIG. 5B illustrates the case that the phase of the clock signal C0 is substantially the same as the phase of the preamble signal D0. The feedback detection signal FEED is deactivated when the reference detection signal REF is deactivated. Therefore the phase of the clock signal C0 is maintained. FIG. 5C illustrates the case that the phase of the clock signal C0 lags the phase of the preamble signal D0. The feedback detection signal FEED is deactivated after the reference detection signal REF is deactivated. Therefore, the phase of the clock signal C0 is increased.

Figure 6:
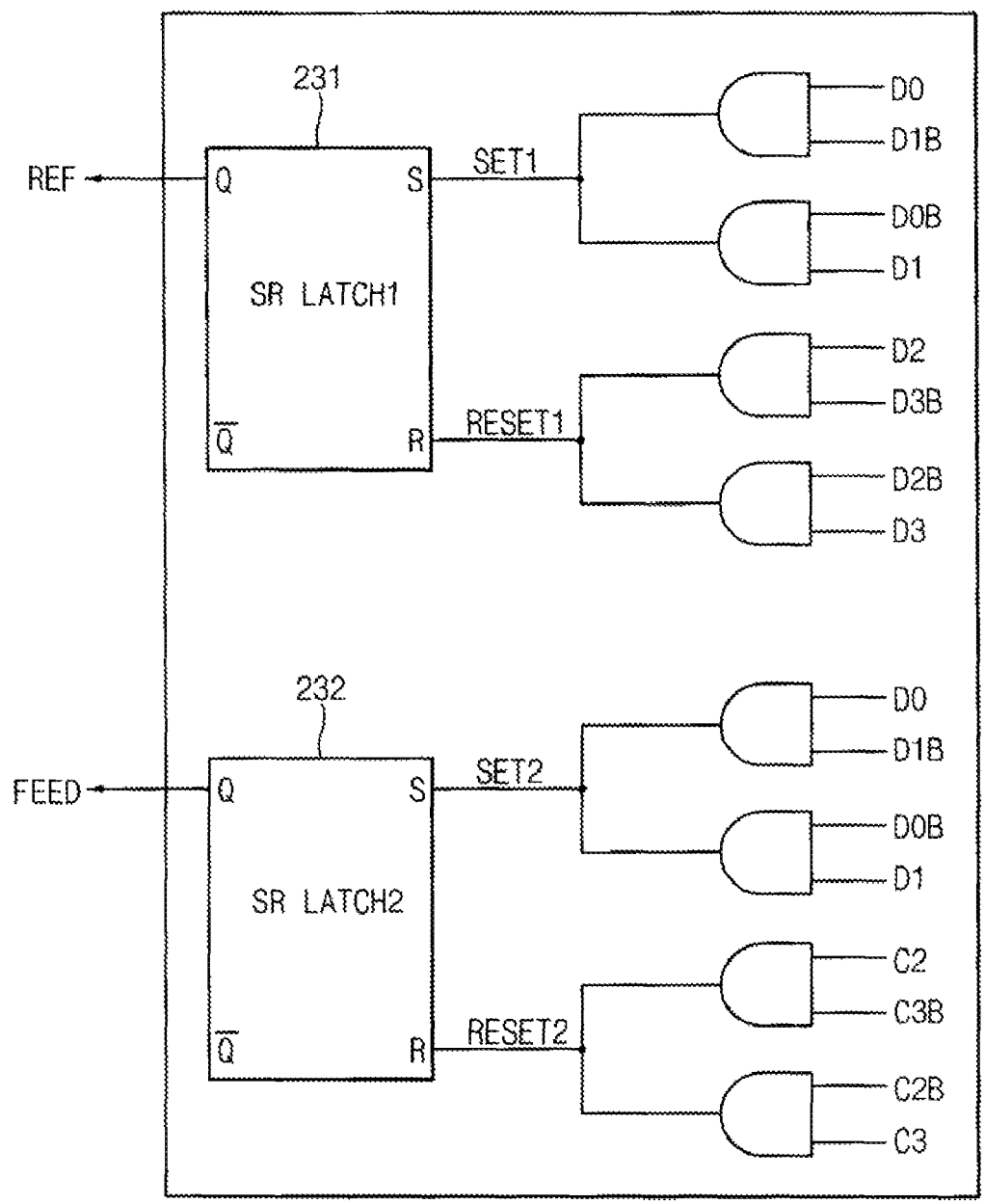
FIG. 6 is a block diagram illustrating a preamble phase detection unit in FIG. 2.

FIG. 6 is a block diagram illustrating a preamble phase detection unit such as shown at 23 in FIG. 2.

Referring to FIG. 6, the preamble detection unit 23 includes a first set-reset latch (SR latch) 231 and a second SR latch 232. The first SR latch 231 outputs the reference detection signal REF based on the preamble signal D0, the second delayed preamble signal D2, the complementary preamble signal D0B, and the second complementary delayed preamble signal D2B. The second SR latch outputs the feedback detection signal FEED based on the preamble signal D0, the second delayed clock signal C2, the complementary preamble signal D0B, and the second complementary delayed clock signal C2B.

In general, a SR latch outputs a logic '1' when a set signal is in an active state, and the SR latch outputs a logic '0' when a reset signal is in an active state. The SR latch maintains a present output when both the set signal and the reset signal are in inactive states. An output of the SR latch is uncertain when both the set signal and the reset signal are in active states and, thus, this case should be avoided.

As described above a period when both the preamble signal D0 and the second delayed preamble signal D2 are in active states exists, so that the preamble signal D0 and the second delayed preamble signal D2 should not be directly applied to the first SR latch 231 as a first set signal SET1 and a first reset signal RESET1. If the first set signal SET1 and the first reset signal RESET1 are generated from the preamble signal D0 and the second delayed preamble signal D2 with elimination of the period that both the preamble signal D0 and the second delayed preamble signal 92 are in active states, however, the first SR latch 231 generates the reference detection signal REF without a problem when the preamble signal D0 rises. For example, if the first set signal SET1 is activated from when the preamble signal D0 rises to when the first delayed preamble signal D1 rises and the first reset signal RESET1 is activated from when the second delayed preamble signal D2 rises to when the third delayed preamble signal D3 rises, then the first SR latch 231 may operate without the uncertainty problem in which the output of the SR latch is uncertain.

The reference detection signal REF is also generated when the preamble signal D0 falls. In this situation, a period that both the complementary preamble signal D0B and the second complementary delayed preamble signal D2B are in active states should be avoided. For example, if the first set signal SET1 is activated from when the complementary preamble signal D0B rises to when the first complementary delayed preamble signal D1B rises and the first reset signal RESET1 is activated from when the second complementary delayed preamble signal D2B rises to when the third complementary delayed preamble signal D3B rises, then the first SR latch 231 may operate without the uncertainty problem.

The first SR latch 231 receives the first set signal SET1 that is generated by either a signal generated by an AND operation between the preamble signal D0 and the first complementary delayed preamble signal D1B, or a signal generated by an AND operation between the complementary preamble signal D0B and the first delayed preamble signal D1. Therefore, the first set signal SET1 may be activated at a rising edge and a falling edge of the preamble signal D0 during one-eighth of the period of the preamble signal D0.

Also, the first SR latch 231 receives the first reset signal RESET1 that is generated by either a signal generated by an AND operation between the second delayed preamble signal D2 and the third complementary delayed preamble signal D3B, or a signal generated by an AND operation between the second complementary preamble signal D2B and the third delayed preamble signal D3. Therefore, the first reset signal RESET1 may be activated at a rising edge and a falling edge of the second preamble signal D2 during one-eighth of the period of the preamble signal D0.

The first SR latch 231 generates the reference detection signal REF that is activated at a rising edge and a failing edge of the preamble signal D0 during a quarter of the period of the preamble signal D0, respectively, by receiving the first set signal SET1 and the first reset signal RESET1 generated as described above.

The second SR latch 232 generates the feedback detection signal FEED in a similar manner to the first SR latch 231 as described above. A second set signal SET2 is activated from when the preamble signal D0 rises to when the first delayed preamble signal D1, and a second reset signal RESET2 is activated from when the delayed clock signal C2 rises to when the third delayed clock signal C3 rises.

The feedback detection signal FEED is also generated when the preamble signal D0 falls. The second set signal SET2 is activated from when the complementary preamble signal D0B rises to when the first complementary delayed preamble signal D1B rises, and the second reset signal RESET2 is activated from when the second complementary delayed clock signal C2B rises to when the third complementary delayed clock signal C3B rises.

The second SR latch 232 receives second the set signal SET2 that is generated by either a signal generated by an AND operation between the preamble signal D0 and the first complementary delayed preamble signal D1B, or a signal generated by an AND operation between the complementary preamble signal D0B and the first delayed preamble signal D1. Therefore the second set signal SET2 may be activated at a rising edge and a falling edge of the preamble signal D0 during one-eighth of the period of the preamble signal D0.

Also, the second SR latch 232 receives the second reset signal RESET2 that is generated by either a signal generated by an AND operation between the second delayed clock signal C2 and the third complementary delayed clock signal C3B, or a signal generated by an AND operation between the second complementary clock signal C2B and the third delayed clock signal C3. Therefore the second reset signal RESET2 may be activated at a rising edge and a falling edge of the second clock signal C2 during one-eighth of the period of the preamble signal D0.

The second SR latch 232 generates the feedback detection signal FEED that is in active state from when the preamble signal D0 rises and falls to when the second delayed clock signal C2 rises and falls, respectively, by receiving the second set signal SET2 and the second reset signal RESET2 generated as described above.

A conventional SR latch outputs an output signal changing state only at a rising edge of an input signal. The clock and data recovery circuit according to exemplary embodiments of the present invention, however, may generate the reference detection signal REF and the feedback detection signal FEED not only at the rising edge of the preamble signal D0 but also at the falling edge of the preamble signal D0 by using the complementary signals.

As described above, the clock and data recovery circuit and the method of recovering clocks and data according to exemplary embodiments of the present invention may recover the clock signal by using the preamble signal that is an initial section of the data signal and then extract the recovered data from the data signal by using the recovered clock signal. The clock and data recovery circuit may employ the phase-frequency detector having a simple configurations and may recover clocks and data even though the data signal has a higher data transmission rate than a conventional data signal. The clock and data recovery circuit may not consume additional power because circuits recovering the clock signal during the preamble period are deactivated after recovering the clock signal.

While exemplary embodiments of the present invention and their advantages have been described in detail, it should be understood that various changes, substitutions and alterations may be made herein without departing from the scope of the invention.

What is claimed is:

1. A clock and data recovery circuit, comprising:
   a clock generation unit including a phase-frequency detector, a charge pump, and a voltage controlled oscillator, the clock generation unit configured to generate a clock signal such that a phase of the clock signal is locked to a phase of a data signal inputted to the clock generation unit;
   a mirror delay unit configured to output a plurality of delayed preamble signals based on a preamble signal of the data signal during a preamble period, the delayed preamble signals having predetermined phase differences with respect to the preamble signal;
   a preamble phase detection unit configured to provide the charge pump with a preamble phase detection signal having information on a phase difference between the preamble signal and the clock signal during the preamble period; and
   a sampling unit configured to extract data from the data signal by sampling the data signal with the clock signal,
   wherein the phase-frequency detector is configured to output a data phase detection signal having information on a phase difference between the data signal and the clock signal,
   wherein the charge pump is configured to output a control voltage that is adjusted by the preamble phase detection signal during the preamble period and by the data phase detection signal after the preamble period,
   wherein the voltage controlled oscillator is configured to output the clock signal having a frequency that is proportional to the control voltage, and is configured to provide the preamble phase detection unit with a plurality of delayed clock signals having predetermined phase differences with respect to the clock signal,
   wherein the voltage controlled oscillator includes a plurality of differential delay cells, and is configured to output the delayed clock signals that are delayed by predetermined times by the differential delay cells from output terminals of the plurality of differential delay cells, and
   wherein each of the plurality of differential delay cells included in the voltage controlled oscillator is configured to delay the delayed clock signals by a time that is one-eighth of a period of the preamble signal.

2. The clock and data recovery circuit of claim 1, wherein the mirror delay unit includes a plurality of series-connected differential delay cells, and is configured to output the delayed preamble signals that are delayed by predetermined times by the differential delay cells.

3. The clock and data recovery circuit of claim 2, wherein the plurality of differential delay cells included in the mirror delay unit are configured to delay the delayed preamble signals by the same delay time as differential delay cells included in the voltage controlled oscillator.

4. The clock and data recovery circuit of claim 3, wherein each of the plurality of differential delay cells included in the mirror delay unit is configured to delay the delayed preamble signals by a time that is one-eighth of a period of the preamble signal.

5. The clock and data recovery circuit of claim 2, wherein the preamble phase detection signal includes a first preamble phase detection signal and a second preamble phase detection signal;
   wherein the preamble phase detection unit is configured to output the first preamble phase detection signal having information on a phase difference between the preamble signal and one of the delayed preamble signals, and is configured to output the second preamble phase detection signal having information on a phase difference between the preamble signal and one of the delayed clock signals; and
   wherein the charge pump is configured to increase the phase of the clock signal in case that a pulse width of the second preamble phase detection signal is narrower than a pulse width of the first preamble phase detection signal, and is configured to decrease the phase of the clock signal in case that the pulse width of the second preamble phase detection signal is wider than the pulse width of the first preamble phase detection signal.

6. The clock and data recovery circuit of claim 2, wherein the delayed clock signals include a first delayed clock signal, a second delayed clock signal, and a third delayed clock signal, and the delayed preamble signals include a first delayed preamble signal, a second delayed preamble signal, and a third delayed preamble signal; and wherein the preamble phase detection unit is configured to output a first preamble phase detection signal that is in an active state from when the preamble signal rises and falls to when the second delayed preamble signal rises and falls, respectively, and is configured to output a second preamble phase detection signal that is in an active state from when the preamble signal rises and falls to when the second delayed clock signal rises and falls, respectively.

7. The clock and data recovery circuit of claim 6, wherein the preamble phase detection unit comprises:

a first set-reset (SR) latch configured to output the first preamble phase detection signal, configured to be set at a rising edge and a falling edge of the preamble signal, and configured to be reset at a rising edge and a falling edge of the second delayed preamble signal; and a second SR latch configured to output the second preamble phase detection signal, configured to be set at a rising edge and a falling edge of the preamble signal, and configured to be reset at a rising edge and a failing edge of the second delayed clock signal.

8. The clock and data recovery circuit of claim 7, wherein the first SR latch is configured to be set by a first set signal that is in an active state from when the preamble signal rises and falls to when the first delayed preamble signal rises and falls, respectively, and is configured to be reset by a first reset signal that is in an active state from when the second delayed preamble signal rises and falls to when the third delayed preamble signal rises and falls, respectively; and wherein the second SR latch is configured to be set by a second set signal that is in an active state from when the preamble signal rises and falls to when the first delayed preamble signal rises and falls, respectively, and is configured to be reset by a second reset signal that is in an active state from when the second delayed clock signal rises and fails to when the third delayed clock signal rises and falls, respectively.

9. The clock and data recovery circuit of claim 1, wherein the sampling unit includes a D flip-flop configured to output the data signal in response to one of the delayed clock signals.

10. A method of recovering clocks and data comprising:

recovering a clock signal in response to a preamble phase detection signal having information on a phase difference between a preamble signal and the clock signal during a preamble period maintaining a phase and a frequency of the clock signal in response to a data phase detection signal having information on a phase difference between the data signal and the clock signal after the preamble period; and extracting data from the data signal by sampling the data signal with the clock signal, wherein delay times between the delayed preamble signals are the same, and a sum of the delay times between the plurality of delayed preamble signals is shorter than a half of a period of the preamble signal, and wherein recovering the clock signal during the preamble period includes generating a plurality of delayed preamble signals having predetermined phase differences with respect to the preamble signal;

generating a plurality of delayed clock signals having predetermined phase differences with respect to the clock signal;

generating the preamble phase detection signal having the information on the phase difference between the preamble signal and the clock signal based on the preamble signal the plurality of delayed preamble signals, and the plurality of delayed clock signals; and adjusting the phase of the clock signal in response to the preamble phase detection signal such that the phase of the clock signal is locked to the phase of the preamble signal.

11. The method of claim 10, wherein each of the delay times is one-eighth of the period of the preamble signal.

12. The method of claim 10, wherein delay times between the delayed clock signals are the same, and a sum of the delay times between the delayed clock signals is shorter than a half of a period of the preamble signal.

13. The method of claim 12, wherein each of the delay times is one-eighth of the period of the preamble signal.

14. The method of claim 10, wherein delay times between the plurality of delayed preamble signals are the same as delay times between the plurality of delayed clock signals.

15. The method of claim 10, wherein the preamble phase detection signal includes a first preamble phase detection signal and a second preamble phase detection signal;

wherein generating the preamble phase detection signal includes outputting the first preamble phase detection signal having information on a phase difference between the preamble signal and one of the plurality of delayed preamble signals and outputting the second preamble phase detection signal having information on a phase difference between the preamble signal and one of the plurality of delayed clock signals; and wherein adjusting the phase of the clock signal includes increasing the phase of the clock signal in case that a pulse width of the second preamble phase detection signal is narrower than a pulse width of the first preamble phase detection signal and decreasing the phase of the clock signal in case that the pulse width of the second preamble phase detection signal is wider than the pulse width of the first preamble phase detection signal.

16. The method of claim 10, wherein the plurality of delayed clock signals includes a first delayed clock signal, a second delayed clock signal, and a third delayed clock signal, the plurality of delayed preamble signals includes a first delayed preamble signal, a second delayed preamble signal, and a third delayed preamble signal, and the preamble phase detection signal includes a first preamble phase detection signal and a second preamble phase detection signal;

wherein generating the preamble phase detection signal includes activating the first preamble phase detection signal from when the preamble signal rises and falls to when the second delayed preamble signal rises and falls, respectively, and activating the second preamble phase detection signal from when the preamble signal rises and falls to when the second delayed clock signal rises and falls, respectively; and wherein adjusting the phase of the clock signal includes increasing the phase of the clock signal in case that a pulse width of the second preamble phase detection signal is narrower than a pulse width of the first preamble phase detection signal and decreasing the phase of the clock signal in case that the pulse width of the second preamble phase detection signal is wider than the pulse width of the first preamble phase detection signal.

17. The method of claim 16, wherein generating the preamble phase detection signal comprises:

activating the first preamble phase detection signal by using a first set-reset (SR) latch configured to be set by a first set signal that is in an active state from when the preamble signal rises and falls to when the first delayed preamble signal rises and falls, respectively, and configured to be reset by a first reset signal that is in an active state from when the second delayed preamble signal rises and falls to when the third delayed preamble signal rises and falls, respectively; and activating the second preamble phase detection signal by using a second SR latch configured to be set by a second set signal that is in an active state from when the preamble signal rises and falls to when the first delayed preamble signal rises and falls, respectively, and configured to be reset by a second reset signal that is in an active state from when the second delayed clock signal rises and falls to when the third delayed clock signal rises and falls, respectively.

18. The method of claim 10, wherein extracting the data from the data signal by sampling the data signal with the clock signal includes outputting the data when one of the delayed clock signals is in an active state.

* * * * *